US012666793B2

(12) United States Patent
　Hatano

(10) Patent No.: US 12,666,793 B2
(45) Date of Patent: Jun. 23, 2026

(54) LIGHT-EMITTING DEVICE, DISPLAY DEVICE, PHOTOELECTRIC CONVERSION DEVICE, ELECTRONIC EQUIPMENT, ILLUMINATION DEVICE, AND MOBILE BODY

(71) Applicant: CANON KABUSHIKI KAISHA, Tokyo (JP)

(72) Inventor: Yuuichirou Hatano, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 480 days.

(21) Appl. No.: 18/347,630

(22) Filed: Jul. 6, 2023

(65) Prior Publication Data

US 2024/0047472 A1　　Feb. 8, 2024

(30) Foreign Application Priority Data

Aug. 5, 2022　(JP) ................................. 2022-125357
Apr. 7, 2023　(JP) ................................. 2023-062975

(51) Int. Cl.
　*H10K 50/87*　　　(2023.01)
　*H10K 59/80*　　　(2023.01)
　*H10K 59/88*　　　(2023.01)
(52) U.S. Cl.
　CPC ......... *H10K 50/87* (2023.02); *H10K 59/8794* (2023.02); *H10K 59/88* (2023.02)
(58) Field of Classification Search
　CPC ..... H10K 50/87; H10K 59/8794; H10K 59/88
　See application file for complete search history.

(56) References Cited

U.S. PATENT DOCUMENTS

| | | |
|---|---|---|
| 7,943,226 B2 | 5/2011 | Itai |
| 11,715,420 B2 | 8/2023 | Kawachi |
| 2005/0140273 A1* | 6/2005 | Guo ....................... H10K 50/87 |
| | | 313/504 |
| 2008/0241471 A1 | 10/2008 | Itai |
| 2021/0118961 A1* | 4/2021 | Lee ................... H10K 59/8794 |
| 2021/0383755 A1 | 12/2021 | Kawachi |
| 2022/0293055 A1 | 9/2022 | Hatano |

FOREIGN PATENT DOCUMENTS

| | | |
|---|---|---|
| JP | 2003-007456 A | 1/2003 |
| JP | 2007-081094 A | 3/2007 |
| JP | 2008-251450 A | 10/2008 |
| JP | 2011-040195 A | 2/2011 |
| JP | 2021-196397 A | 12/2021 |

* cited by examiner

*Primary Examiner* — Peter M Albrecht
(74) *Attorney, Agent, or Firm* — Venable LLP

(57) ABSTRACT

A light-emitting device has a plurality of light-emitting elements, wherein the light-emitting element has a substrate having a transistor element that drives the light-emitting element, a wiring layer that is arranged over the substrate, and a light-emitting unit that is arranged over the wiring layer and includes an anode electrode, a light-emitting layer arranged on the anode electrode, and a cathode electrode arranged on the light-emitting layer, and heater wiring is arranged between the light-emitting unit and the wiring layer in at least some of the plurality of light-emitting elements.

17 Claims, 10 Drawing Sheets

LIGHT-EMITTING DEVICE, DISPLAY DEVICE, PHOTOELECTRIC CONVERSION DEVICE, ELECTRONIC EQUIPMENT, ILLUMINATION DEVICE, AND MOBILE BODY

BACKGROUND OF THE INVENTION

Field of the Invention

The present invention relates to a light-emitting device, a display device, a photoelectric conversion device, electronic equipment, an illumination device, and a mobile body.

Description of the Related Art

Light-emitting devices using an organic electroluminescent (hereinafter called organic EL) film have light-emitting elements provided in respective pixels, and individually control light emission to display images. It is proposed in Japanese Patent Application Laid-open No. 2003-007456 that a reduction in the light-emitting efficiency of organic EL elements is suppressed by heaters provided separately from a semiconductor substrate. It is proposed in Japanese Patent Application Laid-open No. 2011-040195 that a reduction in light-emitting efficiency at a low temperature is suppressed by heaters arranged on the rear surface of a display panel including organic EL elements.

Light-emitting devices using organic EL provide a configuration in which a plurality of heaters are separately arranged near organic EL elements in order to maintain a difference in the brightness between the plurality of organic EL elements at not more than a constant value, and a driving time is controlled to change a heating amount for each of the heaters. Further, the light-emitting devices provide a configuration in which heaters are arranged so that heat is transmitted to entire organic EL elements in order to suppress the acceleration of the degradation speed of the organic EL elements under a specific environment such as a low temperature at which light-emitting efficiency reduces.

However, these configurations require the preparation of another control system for controlling the temperatures of the heaters and the physical securement of the distances between the heaters and the organic EL elements. Further, these configurations have a problem that the heat conduction of the heaters is susceptible to outside air.

SUMMARY OF THE INVENTION

The present invention provides a technology to improve the temperature controllability of light-emitting elements and alleviate a reduction in the brightness of the light-emitting elements due to a reduction in temperature.

A light-emitting device according to the present invention has a plurality of light-emitting elements, wherein the light-emitting element has a substrate having a transistor element that drives the light-emitting element, a wiring layer that is arranged over the substrate, and a light-emitting unit that is arranged over the wiring layer and includes an anode electrode, a light-emitting layer arranged on the anode electrode, and a cathode electrode arranged on the light-emitting layer, and heater wiring is arranged between the light-emitting unit and the wiring layer in at least some of the plurality of light-emitting elements.

Further features of the present invention will become apparent from the following description of exemplary embodiments with reference to the attached drawings.

BRIEF DESCRIPTION OF THE DRAWINGS

FIG. 1 is a schematic configuration diagram of a light-emitting device;

FIG. 2 is a diagram showing a configuration example of heater wiring;

DESCRIPTION OF THE EMBODIMENTS

First Embodiment

Figures 3, 4:
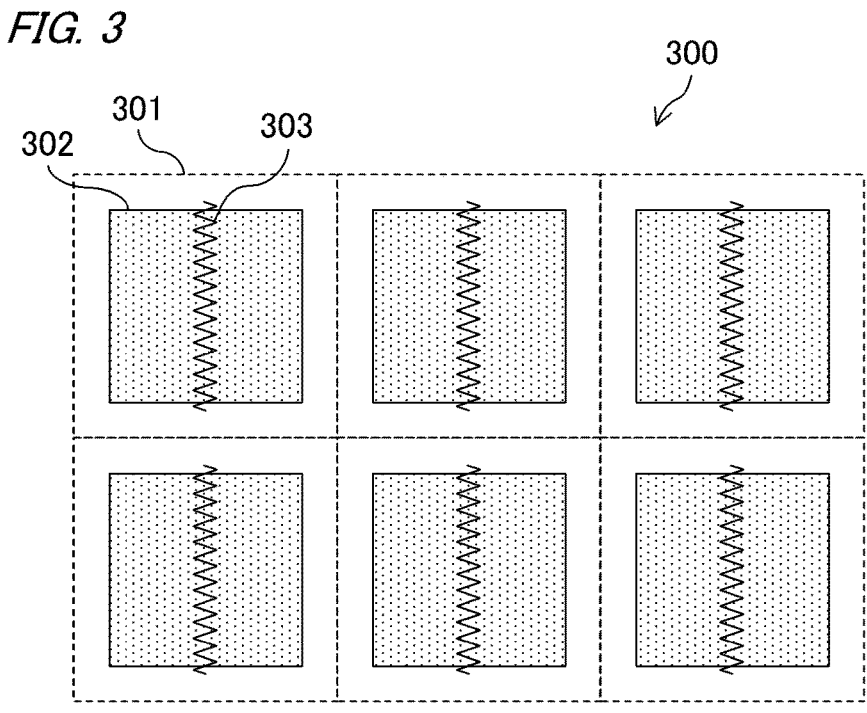
FIG. 3 is a schematic plan diagram of a light-emitting device according to a first embodiment.
FIG. 4 is a schematic plan diagram of a light-emitting device according to a second embodiment.

A first embodiment of the present invention will be described. A light-emitting device according to the present embodiment has a plurality of light-emitting elements. The light-emitting elements has a substrate, a wiring layer arranged over the substrate, and a light-emitting unit arranged over the wiring layer, and heater wiring is provided between the light-emitting unit and the wiring layer. The light-emitting unit includes an anode electrode, a light-emitting layer arranged on the anode electrode, and a cathode electrode arranged on the light-emitting layer.

Figures 1, 2:
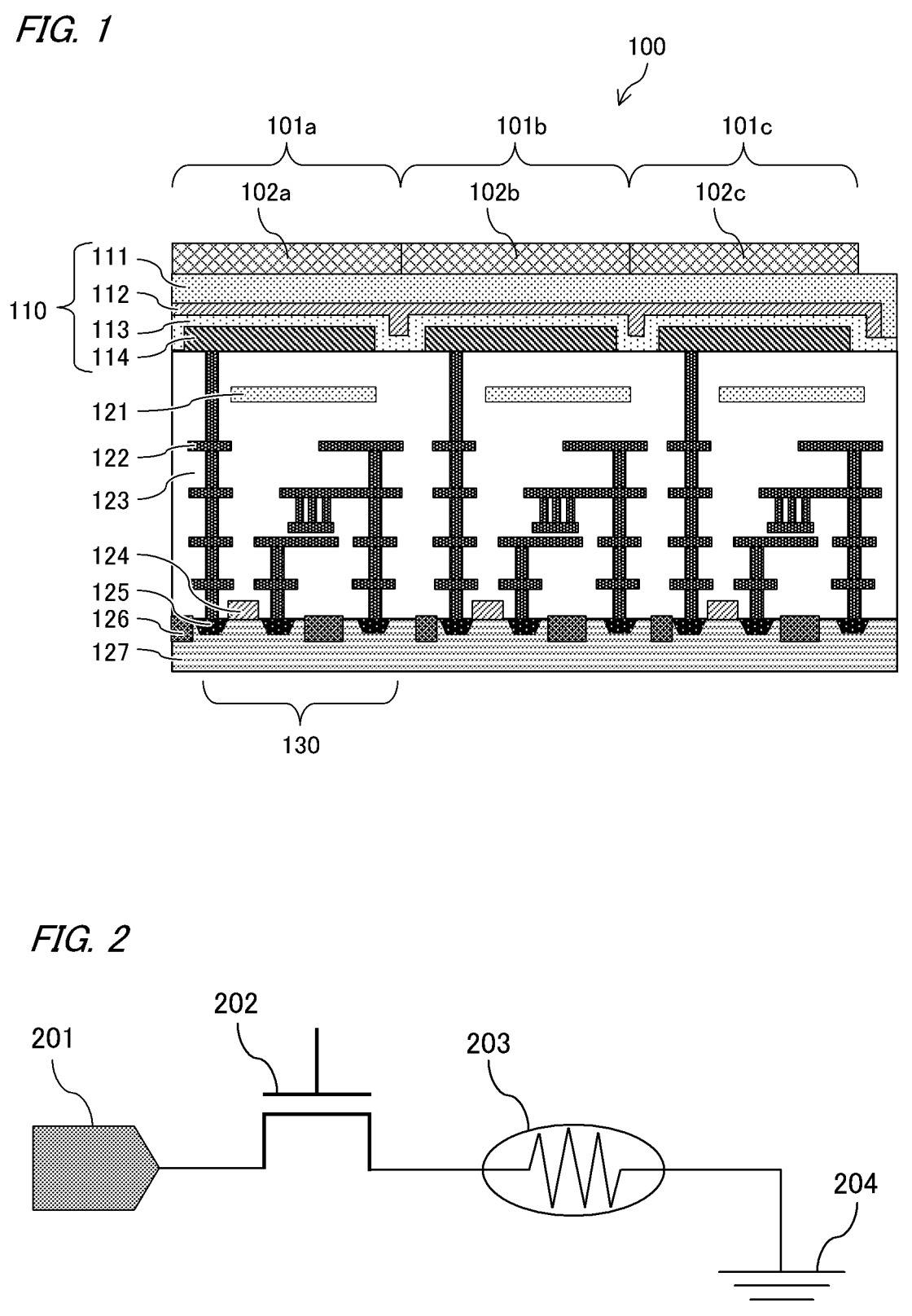

FIG. 1 is a schematic configuration diagram of a light-emitting device according to the respective embodiments of the present technology. In a light-emitting device 100 (semiconductor chip) according to a first embodiment, a plurality of light-emitting elements are arranged in an array shape. FIG. 1 shows three light-emitting elements 101a, 101b, and 101c. The light-emitting elements 101a to 101c will be generically described as light-emitting elements 101. Over the substrate 127 of the light-emitting elements 101, a plurality of interlayer films 123 and wiring layers 122 are arranged.

Over the plurality of wiring layers 122, heater wiring 121 is arranged via the interlayer films 123. As the material of the heater wiring 121, general metal wiring may be used. However, it is also possible to form the heater wiring 121 using a material having a resistance value higher than that of the metal wiring. The material having the resistance value higher than that of the metal wiring is, for example, titanium, tantalum, palladium, magnesium, or the like, and is capable of realizing more effective heat generation than the general metal wiring. The heater wiring 121 easily generates heat when made of the material having the resistance value higher than that of the metal wiring. Over the heater wiring 121, light-emitting units 110 are arranged via the interlayer films 123. The heater wiring 121 is provided in the layer between the light-emitting units 110 and the wiring layers 122.

The light-emitting units 110 include an anode electrode 114, a light-emitting layer 113, a cathode electrode 112, and a protection layer 111. In the present embodiment, the heater wiring 121 is electrically independent from the anode electrode 114 and the cathode electrode 112. In FIG. 1, color filters 102a to 102c are arranged on the light-emitting elements 101a to 101c, respectively. The color filters 102a to 102c will be generically described as color filters 102.

A transistor element 130 (control circuit) has well regions 125 formed by doping a semiconductor substrate with impurities and gate electrodes 124 that control the formation of the channel between the well regions 125. The transistor element 130 has a general structure in which element isolation regions 126 are provided with respect to adjacent transistor elements 130.

FIG. 2 is a diagram showing a configuration example of heater wiring. Heater wiring 203 corresponds to the heater wiring 121 of FIG. 1. One side of the heater wiring 203 is connected to a power supply terminal 201 via a control transistor 202, and the other side thereof is connected to a grounding power 204 (reference power). When a current corresponding to a difference in the voltage between both ends of the heater wiring 203 flows through the heater wiring 203, the heater wiring 203 serves as a heat source using its resistance heat and is enabled to heat the light-emitting units 110 of the light-emitting elements 101.

Note that the configuration shown in FIG. 2 is an example. The heater wiring 203 may be directly connected to the power supply terminal 201 with the control transistor 202 not interposed between the one side of the heater wiring 203 and the power supply terminal 201, and may be connected to the control transistor 202 on the side of the grounding power 204. Further, the heater wiring 203 may be connected to another power capable of generating a potential difference with the power supply terminal 201 rather than being connected to the grounding power 204.

For example, the heater wiring 203 is controlled so as to heat the light-emitting units 110 with a current flowing therethrough, for example, when the temperature of the substrate 127 becomes not more than a prescribed threshold. The temperature of the heater wiring 203 is controlled by the amount of a current flowing through the heater wiring 203 and the resistance value of the heater wiring 203.

FIG. 3 is a schematic plan diagram of a light-emitting device according to the first embodiment. A light-emitting device 300 has a plurality of light-emitting elements 301, and the cross-section structure of the light-emitting elements 301 is the same as that of the light-emitting elements 101 shown in FIG. 1. In a plan view, the light-emitting elements 301 contain an anode electrode 302 (corresponding to the anode electrode 114). Heater wiring 303 (corresponding to the heater wiring 121) is arranged so as to overlap a part of the anode electrode 302.

FIG. 3 is an example of the overlapping manner of the heater wiring 303 with respect to the anode electrodes 302 and the routing regions of the wiring (regions including the heater wiring 303 in a plan view), and the heater wiring 303 may be arranged so as to straddle and overlap at least two anode electrodes 302. Note that the arrangement of the heater wiring 303 for each of the light-emitting elements 301 enables the light-emitting device 300 to realize temperature control according to the light-emitting efficiency of the respective light-emitting elements 301.

As described above with reference to FIG. 2, the heater wiring 303 serves as a heat source using its resistance heat when a current corresponding to a difference in the voltage between both ends of the heater wiring 303 flows through the heater wiring 303, and is enabled to heat the light-emitting units 110 of the light-emitting elements 301. Further, the heater wiring 303 is enabled to easily transfer heat to the light-emitting units 110 when arranged immediately under the anode electrodes 302. Due to the increased ease with which the heat is transferred to the light-emitting elements 301, temperature controllability is improved, making it possible to reduce the size of an area in which a control circuit is arranged.

Further, even under an environment such as a low temperature at which light-emitting efficiency reduces, the light-emitting device 300 is enabled to further alleviate a reduction in the brightness of the light-emitting elements 301 and moderate brightness unevenness in which brightness fluctuates for each of the light-emitting elements 301.

In the case of a configuration in which no heater wiring is provided, control is made to cause a much more current to flow through light-emitting elements that reduce light-emitting efficiency for fear of brightness unevenness. However, the service life of the light-emitting elements shortens when the much more current is caused to flow through the light-emitting elements. The light-emitting device 300 according to the first embodiment is enabled to alleviate the brightness unevenness of the light-emitting elements 301 and suppress a reduction in the service life of the light-emitting elements 301 by controlling the current amount of the heater wiring 303 arranged under the anode electrodes 302 with respect to the light-emitting elements 301.

Second Embodiment

A second embodiment of the present invention will be described. FIG. 4 is a schematic plan diagram of a light-emitting device according to the second embodiment. A light-emitting device 400 includes a plurality of pixels 404. One pixel (main pixel) 404 includes at least three sub-pixels each having a different light-emitting color, and each of the sub-pixels is provided with a light-emitting element 401. The cross-section structure of the light-emitting elements 401 and the configuration of heater wiring 403 are the same as those of the first embodiment. The light-emitting elements 401 contain an anode electrode 402 (corresponding to the anode electrode 114). The heater wiring 403 is arranged so as to overlap a part of the anode electrodes 402 contained in the respective light-emitting elements 401 of the pixels 404 in a plan view.

FIG. 4 is an example of the overlapping manner of the heater wiring 403 with respect to the anode electrodes 402 and the routing regions of the wiring (regions including the heater wiring 403 in a plan view). The heater wiring 403 may be arranged in various shapes and with various lengths. For example, the heater wiring 403 may be arranged so as to straddle the plurality of pixels 404. Further, besides being arranged for each pixel 404 including at least three light-emitting elements 401 each having a different light-emitting color, the heater wiring 403 may be arranged for each two light-emitting elements 401.

In the light-emitting device 400 of the second embodiment, the routing regions of the heater wiring 403 may be made larger than those of the heater wiring 303 of the first
embodiment. When the routing regions of the heater wiring
403 become large (the length of the heater wiring 403
increases), the respective light-emitting elements 401 are
enabled to obtain the same heating value as that of the first
embodiment even in a case in which the amount of a current
caused to flow through the heater wiring 403 is smaller than
that of the first embodiment.

For example, the light-emitting elements 401 shown in
FIG. 4 make it possible to suppress the amount of a current,
which is caused to flow through the heater wiring 403 in
order to obtain the same heating value as that of the heater
wiring 303 of FIG. 3, to about one-third of the amount of a
current caused to flow through the heater wiring 303. Since
it is possible to heat the heater wiring 403 while suppressing
the amount of a current caused to flow through the heater
wiring 403 than the first embodiment, the light-emitting
device 400 is enabled to suppress power consumption and
extend its service life.

Third Embodiment

Figure 5:
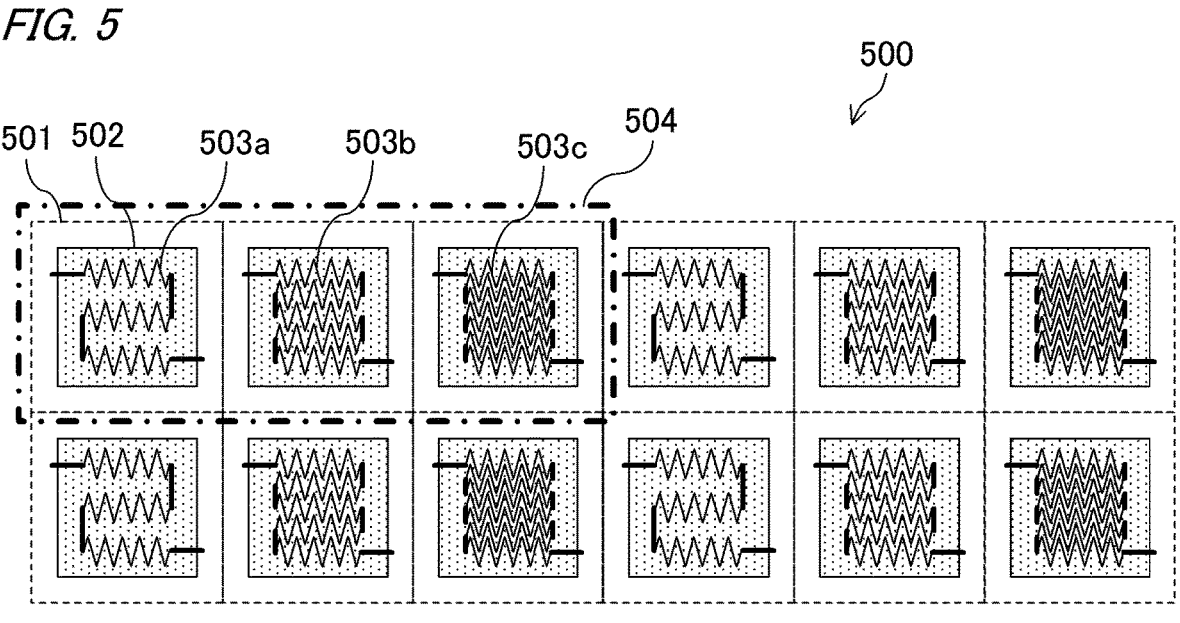
FIG. 5 is a schematic plan diagram of a light-emitting device according to a third embodiment.

A third embodiment of the present invention will be
described. FIG. 5 is a schematic plan diagram of a light-
emitting device according to the third embodiment. A light-
emitting device 500 includes a plurality of pixels 504. One
pixel (main pixel) 504 includes at least three sub-pixels each
having a different light-emitting color. Each of the sub-
pixels is provided with a light-emitting element 501. The
configuration of the cross-section structure of the light-
emitting elements 501 is the same as that of the first
embodiment. The light-emitting elements 501 contain an
anode electrode 502 (corresponding to the anode 114).

The three light-emitting elements 501 included in the
pixel 504 have heater wiring 503a to 503c each having a
different length according to a light-emitting color, respec-
tively. The heater wiring 503a to 503c will be generically
described as heater wiring 503. In a plan view, the heater
wiring 503 has a different routing region, different length,
and different density for each of the light-emitting colors of
the light-emitting elements 501 included in the pixels 504.
Since there are differences in the light-emitting efficiency of
the light-emitting elements 501 between the light-emitting
colors, the heater wiring 503 arranged in the light-emitting
elements 501 is preferably made longer as the light-emitting
efficiency of the light-emitting elements 501 is lower.
Accordingly, the longer heater wiring 503 is arranged in the
light-emitting elements 501 having lower light-emitting
efficiency.

Note that the heater wiring 503 may not be arranged in the
light-emitting elements 501 having color filters 102 of
prescribed light-emitting colors that hardly reduce light-
emitting efficiency. Further, FIG. 5 shows an example of the
overlapping manner of the heater wiring 503 with respect to
the anode electrodes 502 and the routing regions of the
wiring (regions including the heater wiring 503 in a plan
view). The heater wiring 503 may be arranged in various
shapes and with various lengths and densities.

In the light-emitting device 500 of the third embodiment,
the heater wiring 503 has a length corresponding to the
light-emitting efficiency of each of the light-emitting colors
of the light-emitting elements 501. The longer heater wiring
503 is arranged in the light-emitting elements 501 of light-
emitting colors having lower light-emitting efficiency lower than
those of other light-emitting colors. Thus, the light-emitting
device 500 is enabled to tightly control a heating amount
according to the light-emitting efficiency of the light-emitting elements 501 while suppressing the amount of a current
caused to flow through the heater wiring 503. The light-
emitting device 500 is enabled to obtain the effect of
alleviating the brightness unevenness of the light-emitting
elements 501 and suppressing a reduction in the service life
of the light-emitting elements 501 like the first embodiment
while suppressing power consumption of the entire light-
emitting device than the first embodiment.

Fourth Embodiment

Figure 6:
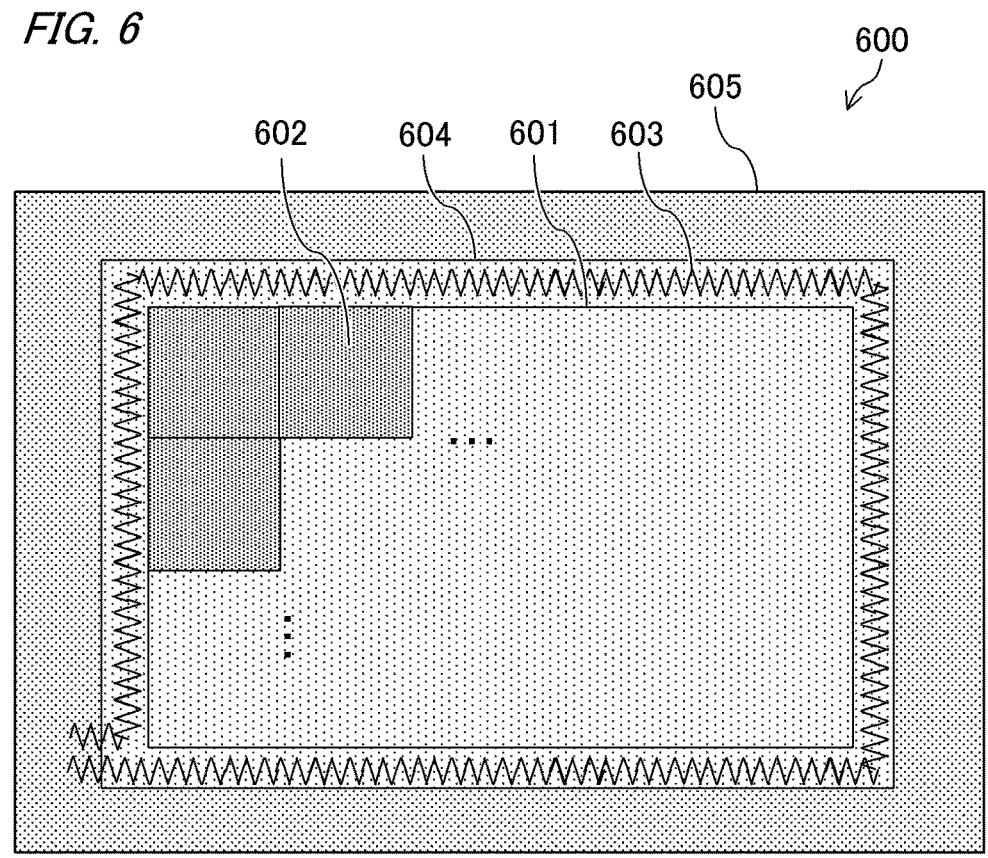
FIG. 6 is a schematic plan diagram of a light-emitting device according to a fourth embodiment.

A fourth embodiment of the present invention will be
described. FIG. 6 is a schematic plan diagram of a light-
emitting device according to the fourth embodiment. A
light-emitting device 600 has a light-emitting element region
601, a light-emitting element outer peripheral region 604,
and a surrounding region 605. The light-emitting element
region 601 is a region having a plurality of light-emitting
elements 602. The light-emitting element outer peripheral
region 604 is a region which is provided on the outer
periphery of the light-emitting element region 601 and in
which dummy light-emitting elements (pseudo light-emit-
ting elements) or the like are arranged. The surrounding
region 605 is a region including various control circuits that
control the driving of the light-emitting elements 602.

The light-emitting element outer peripheral region 604 is
provided between the light-emitting element region 601 and
the surrounding region 605. The dummy light-emitting
elements arranged in the light-emitting element outer
peripheral region 604 have heater wiring 603. The dummy
light-emitting elements may include light-emitting units
110, or may include the light-emitting units 110 and some
light-emitting driving elements (transistor elements). Fur-
ther, a part of the light-emitting element outer peripheral
region 604 serves as a region in which wiring that connects
the control circuit of the surrounding region 605 and the
light-emitting elements 602 of the light-emitting element
region 601 is arranged. The heater wiring 603 is provided in
the layer between the light-emitting units 110 of the dummy
light-emitting elements and wiring layers 122. Further, a
configuration in which the heater wiring 603 is connected to
a power supply terminal 201 or the like is the same as the
configuration described above with reference to FIG. 2.

Note that a shape in which the one heater wiring 603 is
arranged along the light-emitting element outer peripheral
region 604 as shown in FIG. 6 is an example. It is possible
to arrange the heater wiring 603 in various shapes in the
light-emitting element outer peripheral region 604. For
example, the heater wiring 603 includes a plurality of heater
wiring, and the plurality of heater wiring is arranged along
the periphery of the light-emitting element region 601.

Specifically, four heater wiring may be arranged on the
respective sides of the light-emitting element region 601.
Further, a plurality of heater wiring matching the pitch
(width) of the light-emitting elements 602 may be arranged
along the respective sides of the light-emitting element
region 601. Further, one heater wiring may be arranged
along at least one side of the light-emitting element region
601, and a plurality of heater wiring matching the pitch of
the light-emitting elements 602 may be arranged along other
sides of the light-emitting element region 601. In this case,
for example, one heater wiring is arranged along the short
sides of the light-emitting element region 601, and a plu-
rality of heater wiring matching the pitch of the light-
emitting elements 602 is arranged along the long sides of the
light-emitting element region 601.

Figure 7A:
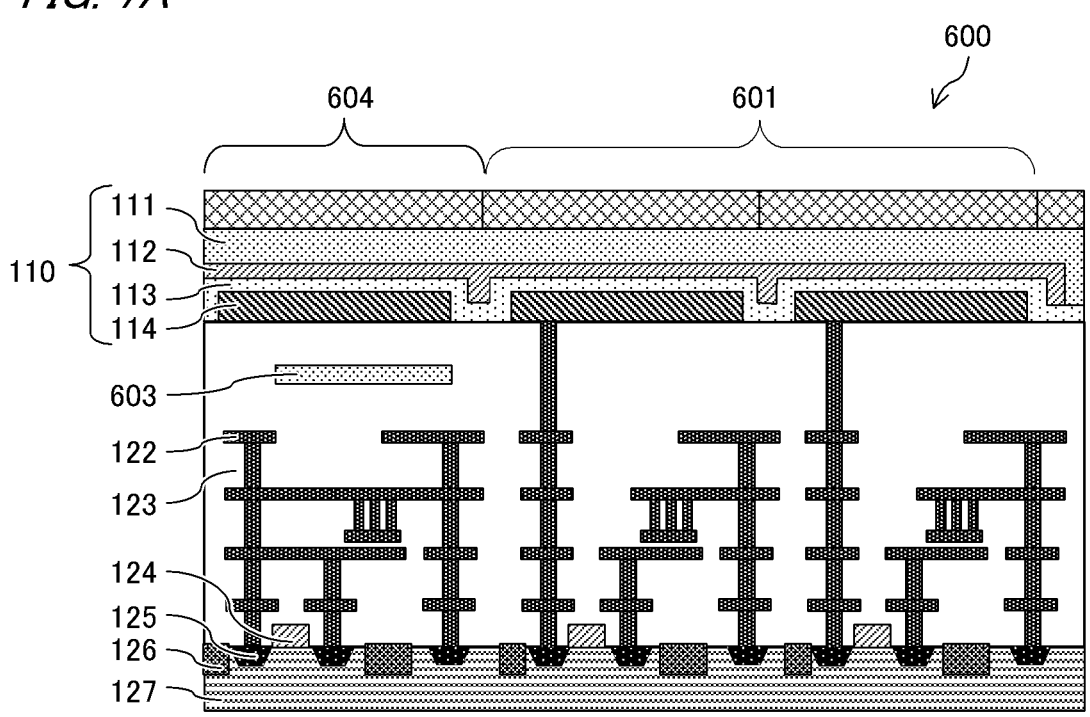
FIGS. 7A and 7B are schematic configuration diagrams of the light-emitting device according to the fourth embodiment.
Figure 7B:
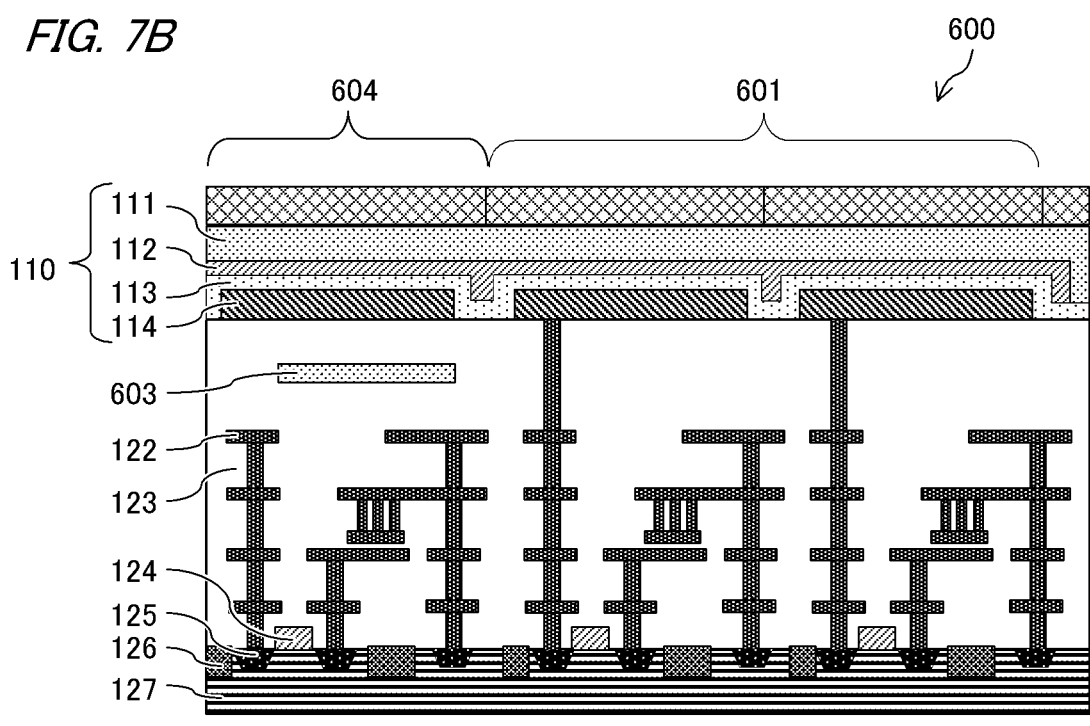

FIGS. 7A and 7B are schematic configuration diagrams of the light-emitting device according to the fourth embodiment. FIG. 7A shows the cross-section structure of the light-emitting device 600 in a case in which a control transistor is not driven in the light-emitting element outer peripheral region 604. FIG. 7B shows the cross-section structure of the light-emitting device 600 in a case in which the control transistor is driven in the light-emitting element outer peripheral region 604. The same configurations as those of FIG. 1 are denoted by the same symbols, and their descriptions will be omitted. In FIGS. 7A and 7B, the heater wiring 603 is arranged with respect to the dummy light-emitting elements of the light-emitting element outer peripheral region 604 and is not arranged with respect to the light-emitting elements 602 of the light-emitting element region 601.

In the light-emitting device 600 of the fourth embodiment, it is possible to arrange the heater wiring 603 without changing the cross-section structure of the light-emitting elements 602 arranged in the light-emitting element region 601. Since the light-emitting device 600 is enabled to have a heater function without any restriction on the routing of various wiring inside the light-emitting elements 602, the degree of freedom in the structure of the light-emitting device 600 becomes higher than the first to third embodiments. Further, since the heater wiring 603 is not provided for each of the light-emitting elements 602, the light-emitting device 600 is enabled to reduce the routing of the heater wiring 603 and the number of the control transistors for the heater wiring 603.

The light-emitting device 600 of the fourth embodiment is enabled to realize a constant heating effect while maintaining the configurations of existing light-emitting devices. The light-emitting device 600 is enabled to reduce areas in which various power supply terminals and the control transistors for the heater wiring 603 are arranged inside the light-emitting device 600 than the first to third embodiments and alleviate a reduction in the brightness of the light-emitting elements 602 that reduce its light-emitting efficiency due to a low temperature or the like.

Fifth Embodiment

Figure 8:
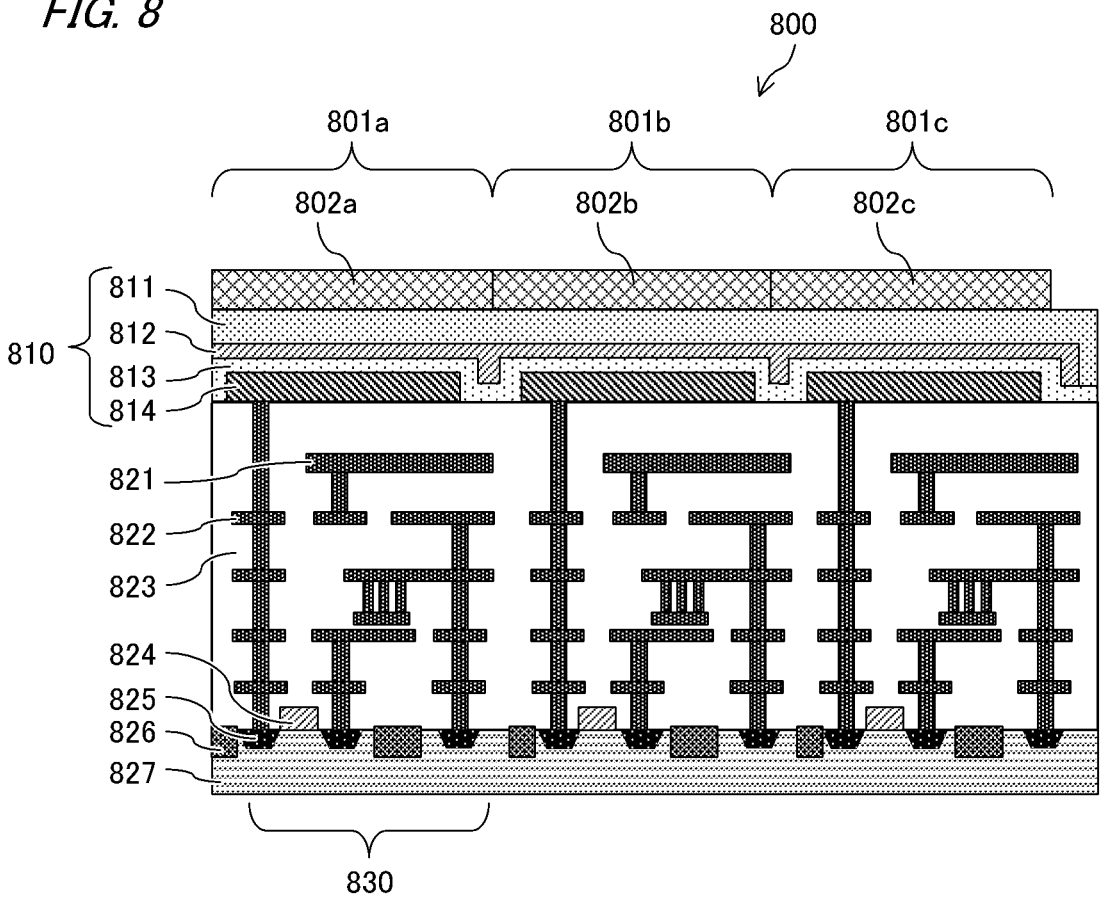
FIG. 8 is a schematic configuration diagram of a light-emitting device according to a fifth embodiment.

A fifth embodiment of the present invention will be described. FIG. 8 is a schematic plan diagram of a light-emitting device according to the fifth embodiment. Like the light-emitting device 100 of FIG. 1, a plurality of light-emitting elements 801 are arranged in an array shape in the light-emitting device 800. FIG. 8 shows three light-emitting elements 801a to 801c. The light-emitting elements 801a to 801c will be generically described as light-emitting elements 801. In the light-emitting elements 801, a plurality of interlayer films 823 and wiring layers 822 are arranged over a substrate 827.

Over the plurality of wiring layers 822, heater driving wiring 821 (heater wiring) is arranged via the interlayer films 823. The heater driving wiring 821 serves also as driving wiring that drives the light-emitting elements 801. As the arrangement of the heater driving wiring 821 in a plan view, the arrangement of the heater wiring (heater wiring 303 to 603) in the first to fourth embodiments is applicable. Over the heater driving wiring 821, light-emitting units 810 are arranged via the interlayer films 823. The heater driving wiring 821 is provided in the layer between the light-emitting units 810 and the wiring layers 822.

The light-emitting units 810 include an anode electrode 814, a light-emitting layer 813, a cathode electrode 812, and a protection layer 811. In FIG. 8, color filters 802a to 802c are arranged on the light-emitting elements 801a to 801c, respectively. The color filters 802a to 802c will be generically described as color filters 802.

In the fifth embodiment, the light-emitting device 800 is not separately provided with heater wiring unlike the first embodiment. Therefore, the light-emitting device 800 may utilize an existing wiring structure as it is to realize a heater function. Since a power voltage supply terminal for a heater and a dedicated power voltage are not provided, areas with respect to the substrate 827 inside and outside the light-emitting device 800 are the same as existing light-emitting devices. Accordingly, the light-emitting device 800 is enabled to suppress an increase in an area and provide the same effects as those of the respective embodiments when the heater driving wiring 821 is arranged like the first to fourth embodiments. Note that in the fourth embodiment, the heater driving wiring 821 may be arranged instead of the heater wiring 603 having the wiring structure shown in FIG. 7B.

Sixth Embodiment

A sixth embodiment of the present invention will be described. The present embodiment will describe examples in which the light-emitting devices (light-emitting devices 100, 300, 400, 500, 600, and 800) according to the first to fifth embodiments are applied to various devices.

Figure 9:
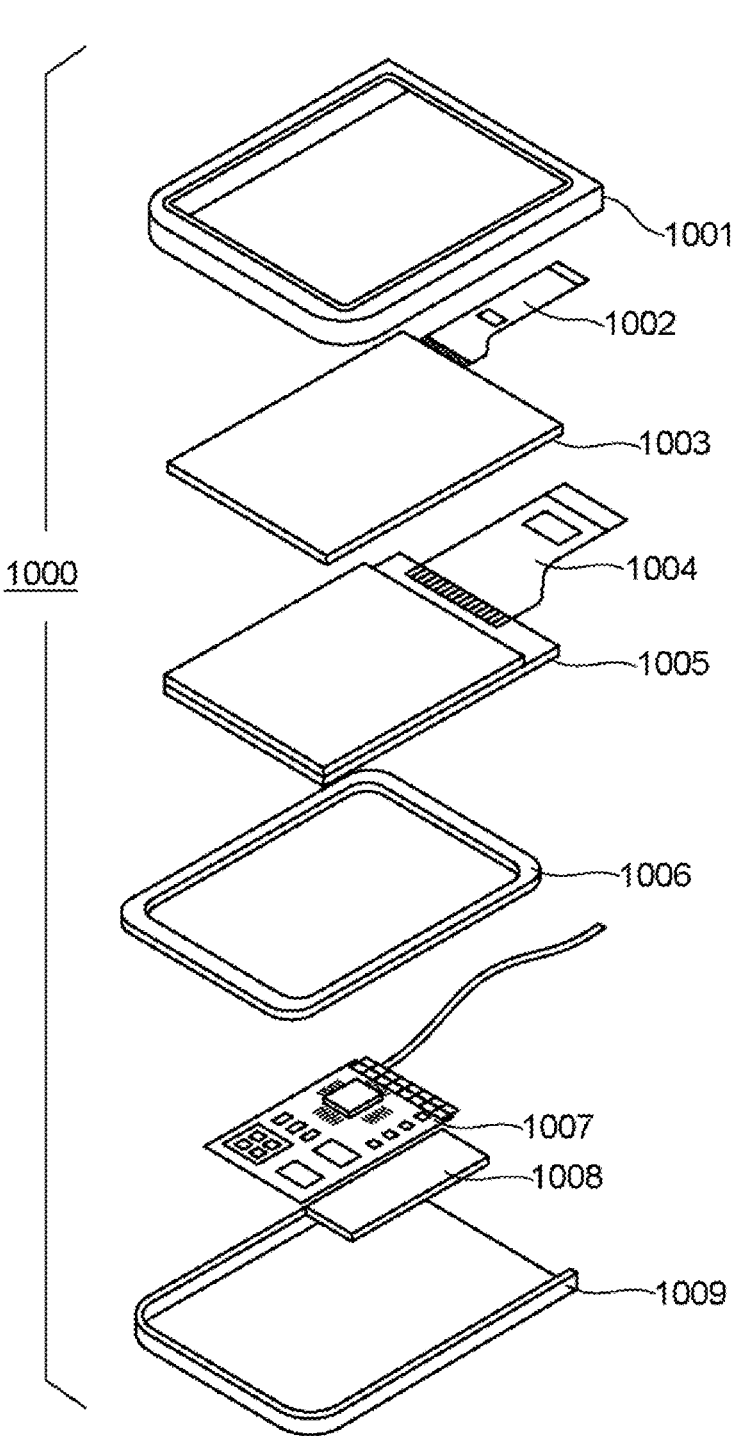
FIG. 9 is a schematic diagram of a display device according to a sixth embodiment.

FIG. 9 is a schematic diagram showing a display device 1000 that is an example of a display device according to the present embodiment. The display device 1000 may have a touch panel 1003, a display panel 1005, a frame 1006, a circuit board 1007, and a battery 1008 between an upper cover 1001 and a lower cover 1009.

The display panel 1005 is a display unit having any of the light-emitting devices according to the first to fifth embodiments, and performs display using light having been emitted from the light-emitting device. Flexible printed circuits FPCs 1002 and 1004 are connected to the touch panel 1003 and the display panel 1005, respectively. The circuit board 1007 has a control circuit including transistors printed thereon, and performs various control such as the control of the display panel 1005. The battery 1008 may not be provided in a case in which the display device 1000 is not mobile equipment, or may be provided in another place even in a case in which the display device 1000 is mobile equipment. The display device 1000 may have the three types of color filters corresponding to red, green, and blue colors, respectively. The plurality of color filters may be arranged in delta arrangement.

The display device 1000 may be used in the display unit of a mobile terminal. At this time, the display device 1000 may have both a display function and an operating function. Examples of the mobile terminal include a mobile phone such as a smart phone, a tablet terminal, a head-mounted display, or the like.

The display device 1000 may be used in the display unit of an imaging device including an optical unit having a plurality of lenses and an imaging element that receives light having passed through the optical unit. The imaging device may have a display unit that displays information having been acquired by the imaging element (such as an image having been captured by the imaging element). Further, the display unit may be a display unit exposed on the outside of the imaging device, or may be a display unit arranged inside a finder. The imaging device may be a digital camera or a digital video camera.

Figure 10A:
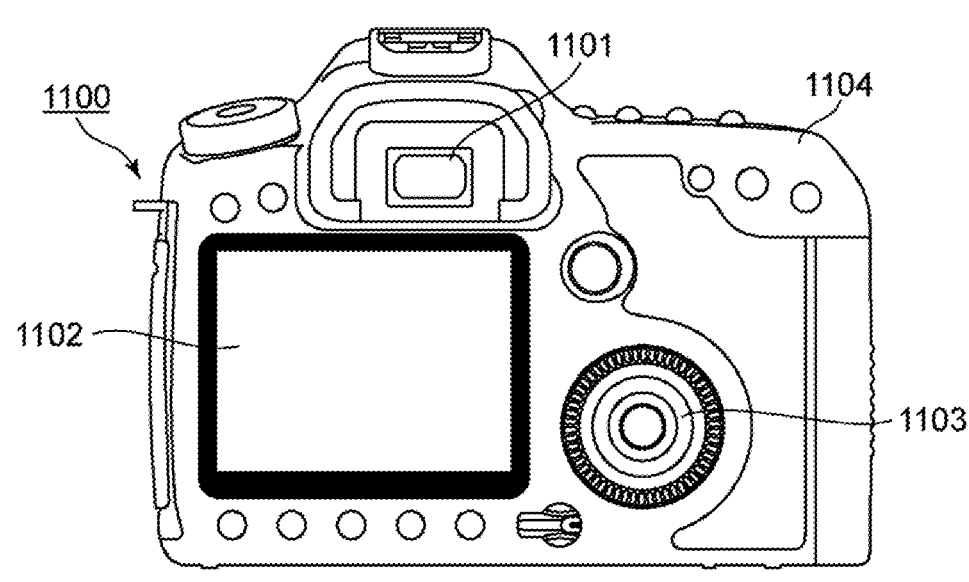
FIG. 10A is a schematic diagram showing an imaging device according to a sixth embodiment.

FIG. 10A is a schematic diagram showing an imaging device 1100 that is an example of an imaging device according to the present embodiment. The imaging device 1100 may have a viewfinder 1101, a rear display 1102, an operating unit 1103, and a housing 1104. The viewfinder 1101 may have the display device according to the present embodiment (display device that has any of the light-emitting devices according to the first to fifth embodiments and performs display using light having been emitted from the light-emitting device). In this case, the display device may display not only a captured image but also environment information, imaging instructions, or the like. The environment information may include the strength of external light, the direction of external light, the movement speed of a subject, a possibility that a subject is shielded by a shielding object, or the like. The rear display 1102 may also have the display device according to the present embodiment.

Since a timing suitable for capturing an image is a short period of time, information is desired to be displayed as soon as possible. Accordingly, a display device using organic light-emitting elements with a fast response speed is preferably used. The display device using the organic light-emitting elements may be more favorably used in a device that requires a fast display speed than a liquid-crystal display device or the like.

The imaging device 1100 has an optical unit not shown. The optical unit has a plurality of lenses, and forms an image of light on an imaging element accommodated in the housing 1104. The plurality of lenses are enabled to adjust a focal point by adjusting their relative positions. This operation may be automatically performed. The imaging device 1100 may be called a photoelectric conversion device. The photoelectric conversion device does not sequentially capture an image but may include a method for detecting a difference with a previous image, a method for cutting out a part of a recorded image, or the like as an imaging method.

Figure 10B:
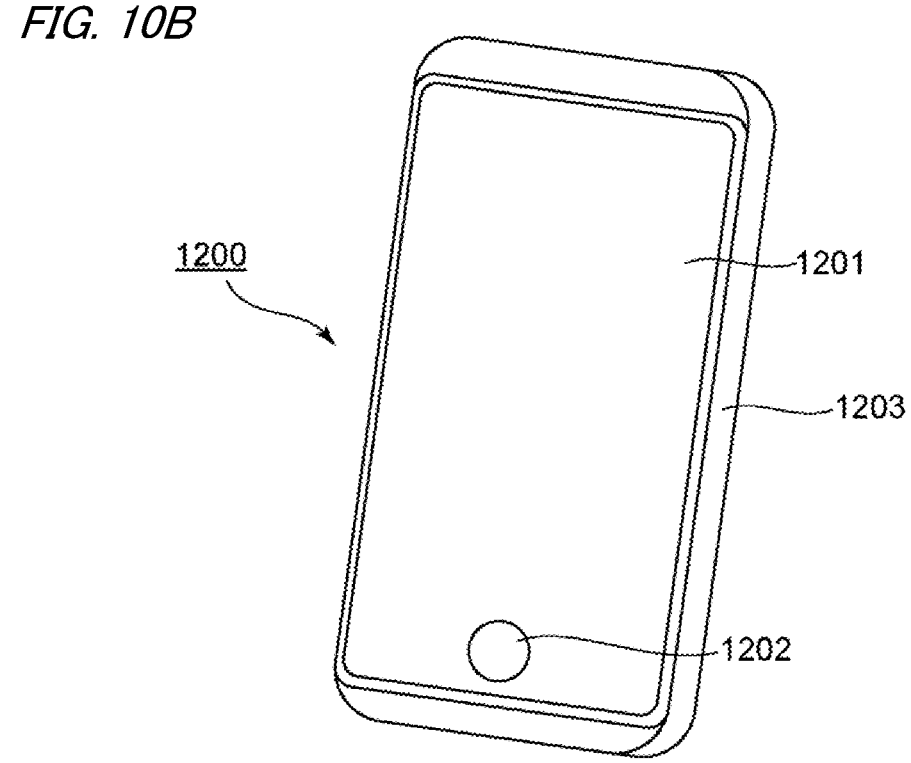
FIG. 10B is a schematic diagram showing electronic equipment according to the sixth embodiment.

FIG. 10B is a schematic diagram showing electronic equipment 1200 that is an example of electronic equipment according to the present embodiment. The electronic equipment 1200 has a display unit 1201, an operating unit 1202, and a housing 1203. The display unit 1201 has any of the light-emitting devices according to the first to fifth embodiments, and performs display using light having been emitted from the light-emitting device. The electronic equipment 1200 may have a circuit, a printed circuit board having the circuit, a battery, and a communication unit that communicates with the outside in the housing 1203. The operating unit 1202 may be a button or a touch-panel-type reaction unit. The operating unit may be a living-body recognition unit that recognizes fingerprints to perform unlocking or the like. The electronic equipment having the communication unit is rephrased as communication equipment. The electronic equipment may have a lens and an imaging element to further have a camera function. An image having been captured by the camera function is reflected on the display unit. Examples of the electronic equipment include a smart phone, a notebook computer, or the like.

Figure 11A:
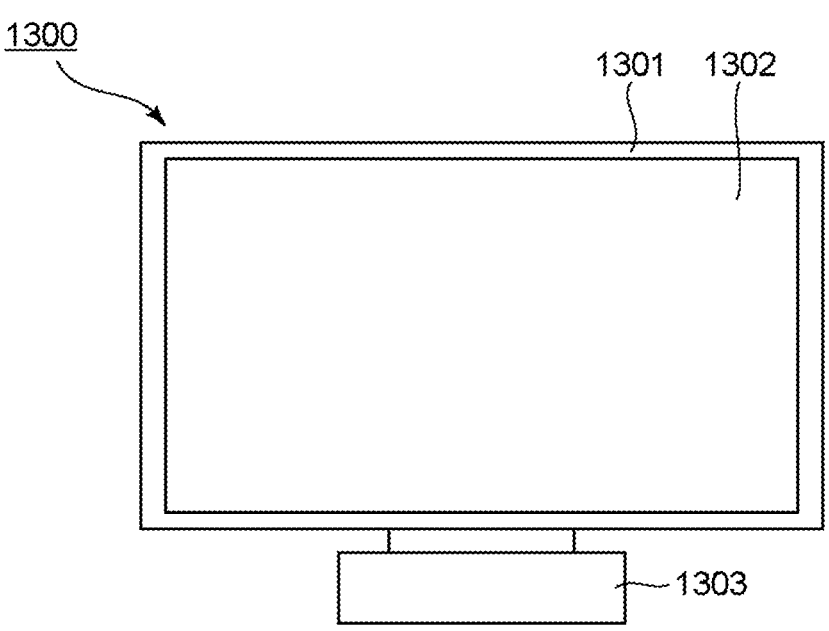
FIGS. 11A and 11B are each a schematic diagram showing a display device according to the sixth embodiment.

FIG. 11A is a schematic diagram showing a display device 1300 that is an example of the display device according to the present embodiment. The display device 1300 is a display device such as a TV monitor and a PC monitor. The display device 1300 has a frame 1301, a display unit 1302, and a base 1303 that supports the frame 1301 and the display unit 1302. The display unit 1302 has any of the light-emitting devices according to the first to fifth embodiments, and performs display using light having been emitted from the light-emitting device. The shape of the base 1303 is not limited to a shape shown in FIG. 11A. The lower side of the frame 1301 may serve as the base 1303. Further, the frame 1301 and the display unit 1302 may be curved. The curvature radii of the frame 1301 and the display unit 1302 may be at least 5000 mm and not more than 6000 mm.

Figure 11B:
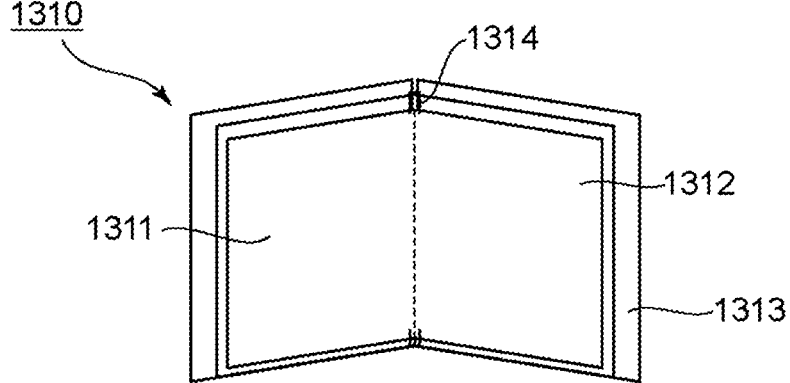

FIG. 11B is a schematic diagram showing a display device 1310 that is another example of the display device according to the present embodiment. The display device 1310 is a so-called foldable display device that is configured to be foldable. The display device 1310 has a first display unit 1311, a second display unit 1312, a housing 1313, and a folding point 1314. Each of the first display unit 1311 and the second display unit 1312 has any of the light-emitting devices according to the first to fifth embodiments, and performs display using light having been emitted from the light-emitting device. The first display unit 1311 and the second display unit 1312 may be one seamless display device. The first display unit 1311 and the second display unit 1312 may be separated from each other at the folding point 1314. The first display unit 1311 and the second display unit 1312 may separately display different images, or may display one image together.

Figure 12A:
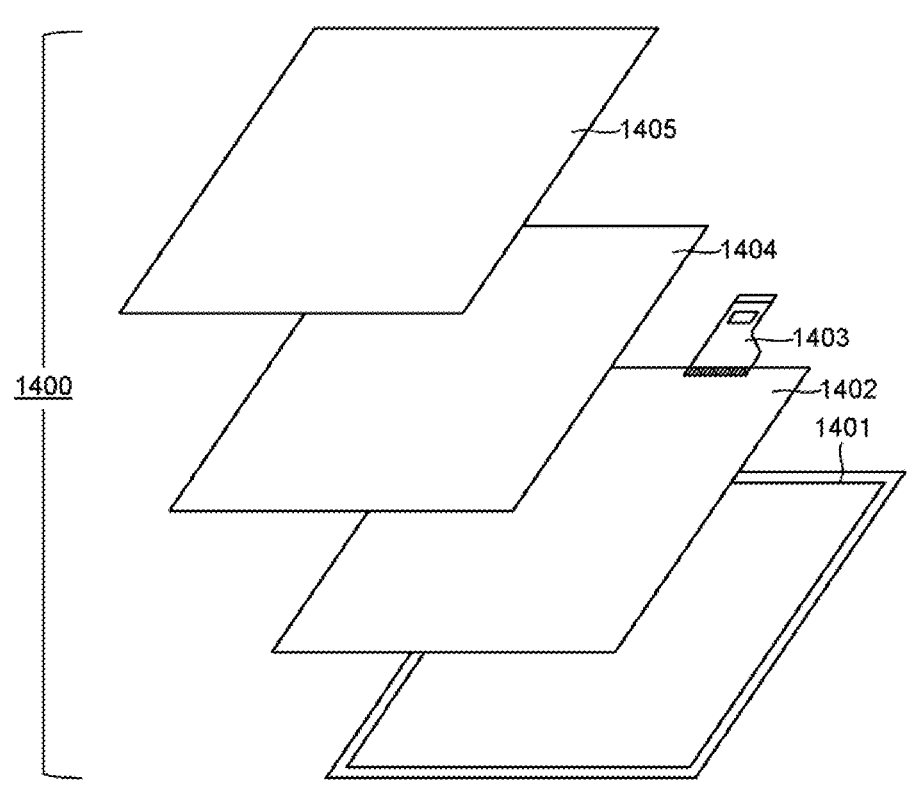
FIG. 12A is a schematic diagram showing an illumination device according to the sixth embodiment.

FIG. 12A is a schematic diagram showing an illumination device 1400 that is an example of an illumination device according to the present embodiment. The illumination device 1400 may have a housing 1401, a light source 1402, a circuit board 1403, an optical film 1404, and a light diffusion unit 1405. The light source 1402 has any of the light-emitting devices according to the first to fifth embodiments. The optical film 1404 may be a filter (optical filter) that improves the color rendering properties of the light source 1402. The light diffusion unit 1405 is enabled to effectively diffuse the light of the light source 1402 and transmit the same to a wide range like illumination. The optical film 1404 and the light diffusion unit 1405 cause light from the light source 1402 to pass therethrough. The optical film 1404 and the light diffusion unit 1405 may be provided on the light-emission side of the illumination device 1400. A cover may be provided at an outermost part where necessary.

The illumination device 1400 is, for example, a device that illuminates the interior of a room. The illumination device 1400 may be one that emits a white color, a neutral white color, and any other color (any of a blue color to a red color). The white color is a color having a color temperature of 4200 K, and the neutral white color is a color having a color temperature of 5000 K. The illumination device 1400 may have a dimmer circuit that dims the light-emitting color of the illumination device 1400. The illumination device 1400 may have a power circuit connected to the light source 1402. The power circuit is a circuit that converts an alternating voltage into a direct voltage. Further, the illumination device 1400 may have color filters. Further, the illumination device 1400 may have a heat-dissipation unit. The heat-dissipation unit dissipates heat inside the device into the outside of the device, and examples of the heat dissipation unit include metal having a high specific heat, liquid silicon, or the like.

Figure 12B:
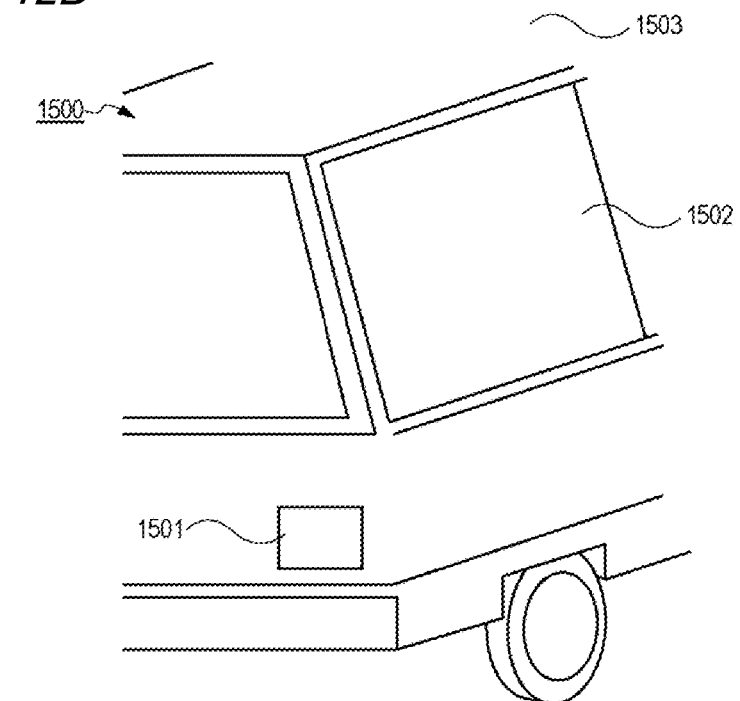
FIG. 12B is a schematic diagram showing a mobile body according to the sixth embodiment.

FIG. 12B is a schematic diagram showing an automobile 1500 that is an example of a mobile body according to the present embodiment. The automobile 1500 may have a tail lamp 1501 that is an example of a lighting unit. The tail lamp 1501 lights up according to a braking operation or the like.

The tail lamp 1501 has any of the light-emitting devices according to the first to fifth embodiments. The tail lamp 1501 may have a protection member that protects the light-emitting device. The protection member may be made of any material so long as the material has high strength to a certain extent and is transparent, but the protection member is preferably made of polycarbonate or the like. The polycarbonate may be mixed with a furandicarboxylic acid derivative, an acrylonitrile derivative, or the like.

The automobile 1500 may have a vehicle body 1503 and windows 1502 attached to the vehicle body 1503. The windows 1502 may be transparent displays unless the windows 1502 are windows for confirming the front and rear sides of the automobile 1500. The transparent displays may have any of the light-emitting devices according to the first to fifth embodiments. In this case, constituting members such as electrodes provided in the light-emitting device are made of a transparent material.

The mobile body according to the present embodiment may be a ship, an airplane, a drone, or the like. The mobile body may have an airframe and a lighting unit provided in the airframe. The lighting unit may illuminate to inform the position of the airframe. The lighting unit has any of the light-emitting devices according to the first to fifth embodiments.

The display device according to the present embodiment (display device that has any of the light-emitting devices according to the first to fifth embodiments and performs display using light having been emitted from the light-emitting device) is also applicable to, for example, a wearable device such as a smart-glasses device, an HMD, and a smart contact lens. The display device according to the present embodiment is also applicable to a system having a wearable device or the like. An imaging display device used as a wearable device or the like has an imaging device capable of photoelectrically converting visible light and a display device capable of emitting visible light.

Figure 13A:
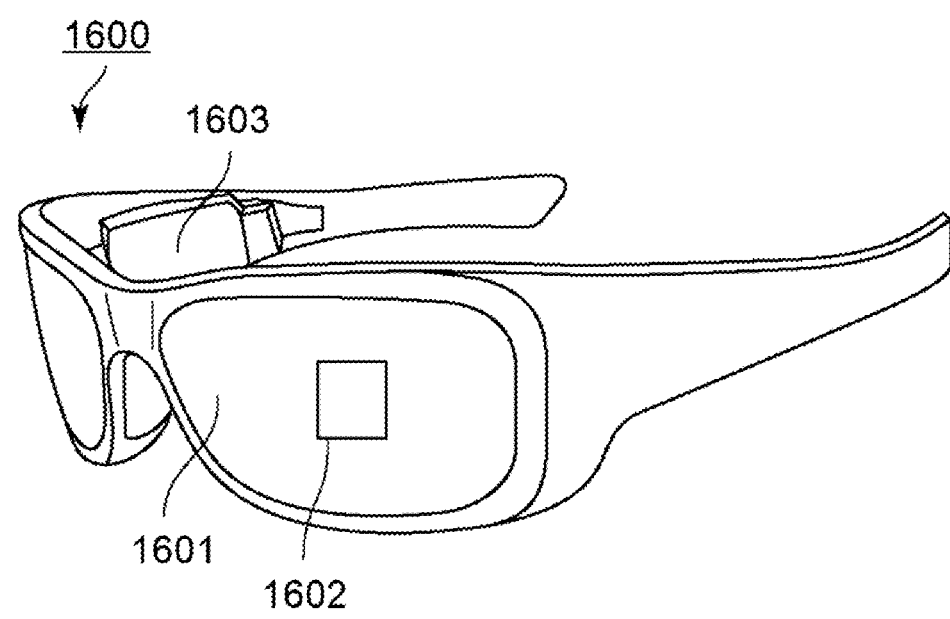
FIGS. 13A and 13B are each a schematic diagram showing a wearable device according to the sixth embodiment.

FIG. 13A is a schematic diagram showing an eyeglasses device 1600 (smart-glasses device) that is an example of a wearable device according to the present embodiment. On the front side of a lens 1601 of the eyeglasses device 1600, an imaging device 1602 such as a CMOS sensor and an SPAD is provided. Further, on the rear side of the lens 1601, the display device according to the present embodiment (display device that has any of the light-emitting devices according to the first to fifth embodiments and performs display using light having been emitted from the light-emitting device) is provided.

The eyeglasses device 1600 further includes a control device 1603. The control device 1603 functions as a power that supplies electric power to the imaging device 1602 and the above display device. Further, the control device 1603 controls the operations of the imaging device 1602 and the display device. The lens 1601 has an optical system for condensing light on the imaging device 1602.

Figure 13B:
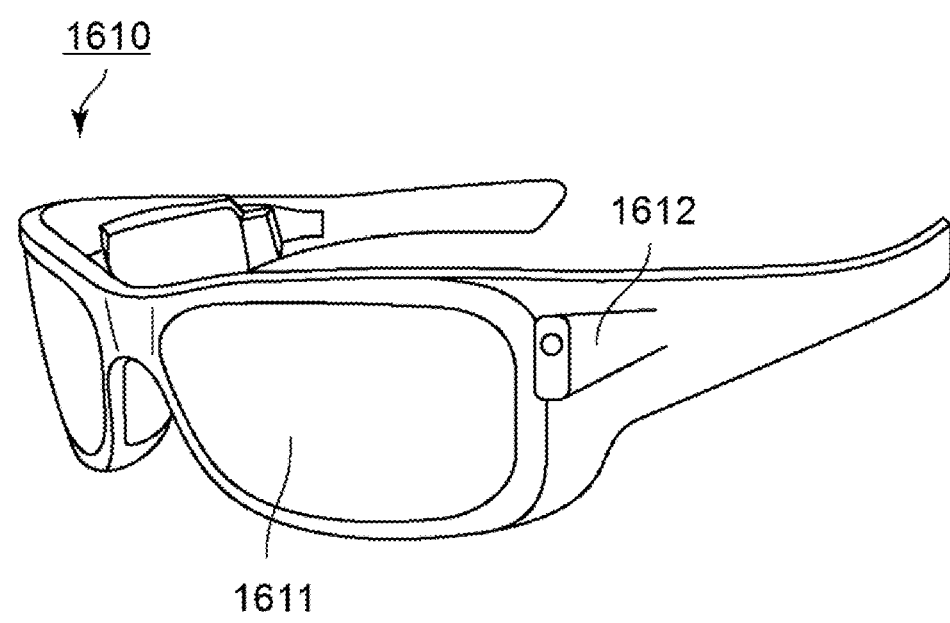

FIG. 13B is a schematic diagram showing an eyeglasses device 1610 (smart-glasses device) that is an example of the wearable device according to the present embodiment. The eyeglasses device 1610 has a control device 1612, and the control device 1612 has an imaging device corresponding to the imaging device 1602 and the display device according to the present embodiment mounted thereon. The lens 1611 has an optical system for projecting light emitted from the imaging device and the display device inside the control device 1612, and an image is projected onto the lens 1611. The control device 1612 functions as a power that supplies electric power to the imaging device and the display device, and controls the operations of the imaging device and the display device.

The control device may have a visual-line detection unit that detects the visual line of a person wearing the eyeglasses device 1610. Infrared light may be used to detect the visual line. An infrared-light emission unit emits infrared light to an eyeball of a user keeping his/her eye on a display image. When an imaging unit having a light-receiving element detects the reflection light of the emitted infrared light reflected from the eyeball, a captured image of the eyeball is obtained. With a reduction unit that reduces light from the infrared-light emission unit to a display unit in a plan view, a degradation in the quality of an image projected from the display device onto the lens 1611 is reduced.

The control device detects the visual line of a user with respect to a display image from a captured image of an eyeball obtained by capturing an image of infrared light. In detecting the visual line using the captured image of the eyeball, any known method is applicable. As an example, a visual-line detection method based on a Purkinje image obtained by the reflection of irradiation light on a cornea may be used.

More specifically, visual-line detection processing based on a pupil corneal reflection method is performed. Using the pupil corneal reflection method, a visual-line vector expressing the direction (rotation angle) of an eyeball is calculated on the basis of a pupil image and a Purkinje image included in a captured image of the eyeball, whereby the visual line of a user is detected.

Note that when display control is performed on the basis of eyeball detection (visual-line detection), the light-emitting devices according to the first to fifth embodiments are preferably applicable to a smart-glasses device having an imaging device that captures an external image. The smart-glasses device is capable of displaying captured external information in real time.

Note that the display device according to the present embodiment (display device that has any of the light-emitting devices according to the first to fifth embodiments and performs display using light having been emitted from the light-emitting device) may have an imaging device having a light-receiving element and control a display image on the basis of visual-line information on a user from the imaging device.

Specifically, a first visual-field region on which a user keeps his/her eye and a second visual-field region other than the first visual-field region are determined on the basis of visual-line information. The first visual-field region and the second visual-field region may be determined by the control device of the display device, or the display device may receive the first visual-field region and the second visual-field region determined by an external control device. In the display region of the display device, the display resolution of the first visual-field region may be controlled to be higher than that of the second visual-field region. That is, the resolution of the second visual-field region may be set to be lower than that of the first visual-field region.

Further, the display region may have a first display region and a second display region different from the first display region, and determine a region with high priority from the first display region and the second display region on the basis of visual-line information. The first display region and the second display region may be determined by the control device of the display device, or the display device may receive the first display region and the second display region determined by an external control device. The resolution of the region with high priority may be controlled to be higher than that of a region other than the region with the high priority. That is, the resolution of a region with relatively low priority may be set to be low.

Note that AI may be used to determine the first visual-field region, the region with high priority, or the like. The AI may be a model configured to estimate, using an eyeball image and a direction in which an eyeball of the image has been actually turned as teacher data, the angle of a visual line and a distance to an object present in the gaze direction of the visual line from the eyeball image. An AI program may be provided in a display device, an imaging device, or an external device. When the AI program is provided in the external device, the AI program is transmitted to the display device via communication.

As described above, the light-emitting devices according to the first to fifth embodiments enable the various devices to perform secured display for a long period of time with excellent image quality.

Note that the respective function units (configurations) of the various devices described in the sixth embodiment may be or may not be individual hardware. The functions of at least two function units may be realized by common hardware. Each of a plurality of functions of one function unit may be realized by individual hardware. At least two functions of one function unit may be realized by common hardware. Further, the respective function units may be or may not be realized by hardware such as an ASIC, an FPGA, and a DSP. For example, a device may have a processor and a memory (storage medium) in which a control program is stored. Further, the functions of at least some function units provided in the device may be realized when the processor reads the control program from the memory and runs the same.

According to the present disclosure, it is possible to improve the temperature controllability of light-emitting elements and alleviate a reduction in the brightness of the light-emitting elements due to a reduction in temperature.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-125357, filed on Aug. 5, 2022 and Japanese Patent Application No. 2023-062975, filed on Apr. 7, 2023, which are hereby incorporated by reference herein in their entirety.

What is claimed is:

1. A light-emitting device having a plurality of light-emitting elements, wherein
the light-emitting element has
a substrate having a transistor element that drives the light-emitting element,
a wiring layer that is arranged over the substrate, and
a light-emitting unit that is arranged over the wiring layer and includes an anode electrode, a light-emitting layer arranged on the anode electrode, and a cathode electrode arranged on the light-emitting layer, and
heater wiring is arranged between the light-emitting unit and the wiring layer in at least some of the plurality of the light-emitting elements.

2. The light-emitting device according to claim 1, wherein the heater wiring is electrically independent from the anode electrode and the cathode electrode.

3. The light-emitting device according to claim 1, wherein one side of the heater wiring is connected to a first power supply terminal or a control transistor, and other side thereof is connected to a second power supply terminal or a grounding power capable of generating a potential difference with the first power supply terminal.

4. The light-emitting device according to claim 1, wherein the heater wiring is arranged so as to overlap a part of the anode electrode arranged in the light-emitting element in a plan view.

5. The light-emitting device according to claim 1, wherein the heater wiring is arranged for each pixel including at least three light-emitting elements each having a different light-emitting color.

6. The light-emitting device according to claim 5, wherein the heater wiring arranged in the light-emitting element has a length corresponding to light-emitting efficiency of a light-emitting color of the light-emitting element.

7. The light-emitting device according to claim 5, wherein the heater wiring is not arranged in the light-emitting element having a color filter of a predetermined light-emitting color.

8. The light-emitting device according to claim 1, wherein a pseudo light-emitting element having the light-emitting unit and the wiring layer is arranged in an outer peripheral region positioned on an outer periphery of a light-emitting element region in which the plurality of the light-emitting elements are arranged in a plan view, and
the heater wiring is arranged in a layer between the light-emitting unit and the wiring layer of the pseudo light-emitting element.

9. The light-emitting device according to claim 8, wherein the heater wiring includes a plurality of wirings, and the plurality of the wirings is arranged along a periphery of the light-emitting element region.

10. The light-emitting device according to claim 1, wherein the heater wiring is made of same wiring as driving wiring that drives the light-emitting element.

11. The light-emitting device according to claim 1, wherein the heater wiring is made of a material having a resistance value higher than a resistance value of metal wiring.

12. The light-emitting device according to claim 11, wherein the material having the resistance value higher than the resistance value of the metal wiring includes at least any of titanium, tantalum, palladium, and magnesium.

13. A display device comprising:

a display unit having the light-emitting device according to claim 1; and a control circuit that controls the display unit.

14. A photoelectric conversion device comprising:

an optical unit;

an imaging element that receives light having passed through the optical unit; and a display unit that displays an image having been captured by the imaging element, wherein the display unit has the light-emitting device according to claim 1.

15. Electronic equipment comprising:

a display unit having the light-emitting device according to claim 1;

a housing in which the display unit is arranged; and a communication unit that is arranged in the housing and communicates with an outside.

16. An illumination device comprising:

a light source having the light-emitting device according to claim 1; and a light diffusion unit or an optical film that causes light from the light source to pass therethrough.

17. A mobile body comprising:

a lighting unit having the light-emitting device according to claim 1; and an airframe in which the lighting unit is arranged.

\* \* \* \* \*